Figure 1:
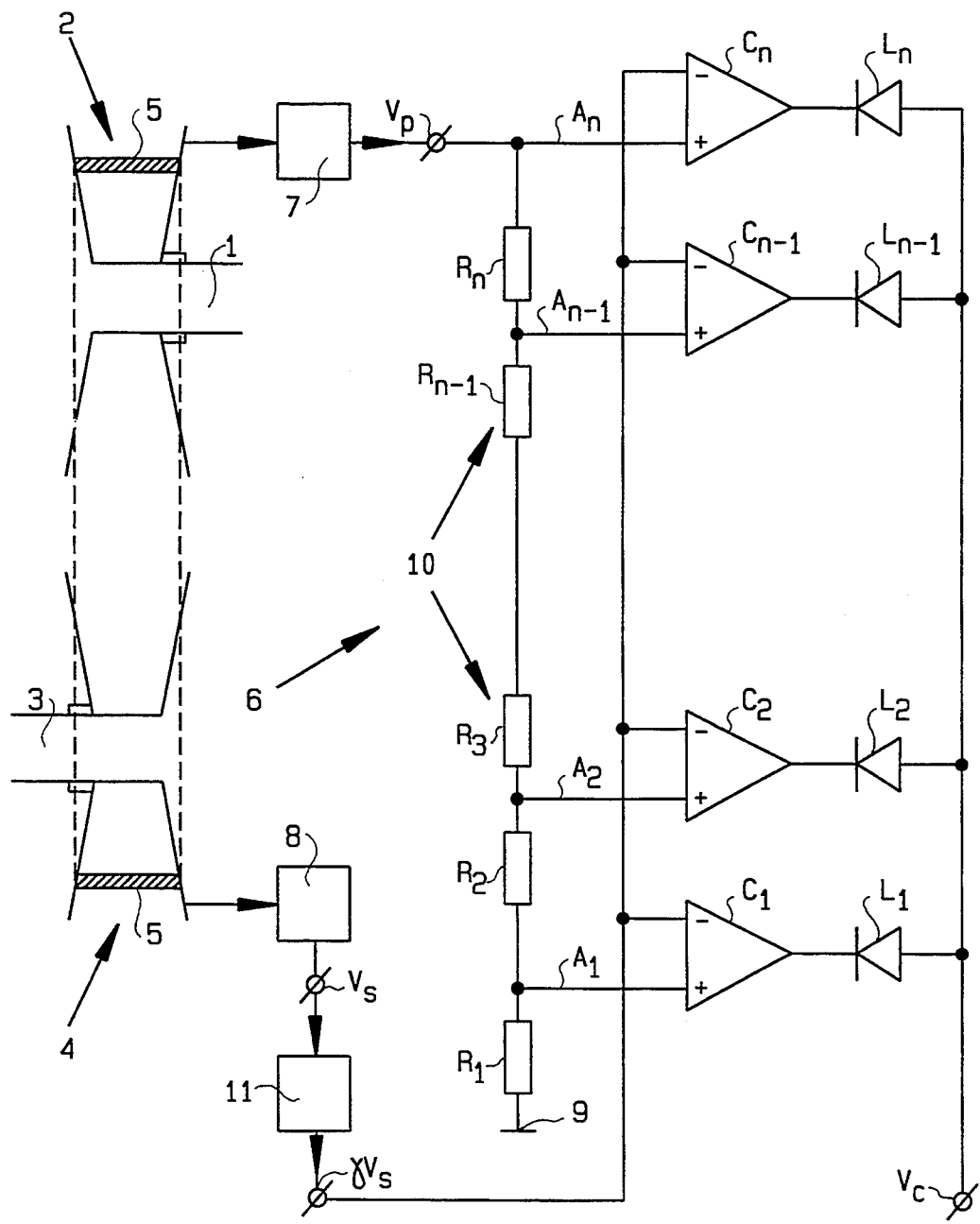

United States Patent [19]
Choi

[11] Patent Number: 5,452,208
[45] Date of Patent: Sep. 19, 1995

[54] DISPLAY DEVICE

[75] Inventor: Chi C. Choi, Eindhoven, Netherlands

[73] Assignee: Van Doorne's Transmissie B.V., Tilburg, Netherlands

[21] Appl. No.: 76,607

[22] Filed: Jun. 14, 1993

[30] Foreign Application Priority Data

Jul. 28, 1992 [NL] Netherlands .................... 9201362

[51] Int. Cl.⁶ .................... F16H 33/02; B60R 1/00
[52] U.S. Cl. .................... 364/424.1; 364/556; 364/505; 364/571.02; 364/565; 477/37; 477/97; 477/45; 477/48; 330/268; 330/298
[58] Field of Search .............. 364/424.1, 565, 424.05, 364/556, 571.02, 507, 508, 505; 250/551, 208; 73/862.08, 862.33, 862.44, 510, 462; 192/0.092, 3.58; 330/268, 298, 59; 477/37, 11, 18, 901, 97, 12, 28, 45, 48

[56] References Cited

U.S. PATENT DOCUMENTS

| | | | |
|---|---|---|---|
| 3,673,400 | 6/1972 | Ito | 364/505 |
| 4,357,832 | 11/1982 | Blackburn et al. | 364/508 |
| 4,457,172 | 7/1984 | Mathes et al. | 364/508 |
| 4,458,318 | 7/1984 | Smit et al. | 364/424.1 |
| 4,471,323 | 9/1984 | Trilling | 330/268 |
| 4,555,943 | 12/1985 | Ohta et al. | 364/508 |
| 4,730,114 | 3/1988 | Portmann | 250/551 |
| 5,025,685 | 6/1991 | Kobayashi et al. | 477/97 |
| 5,239,490 | 8/1993 | Masaki et al. | 364/565 |
| 5,282,400 | 2/1994 | Kobayashi et al. | 364/424.1 |

OTHER PUBLICATIONS

Elektor Electronics, vol. 4, No. 1, Jan. 1978, Canterbury GB, 20–23, "UAA 180 LED Voltmeter", see FIG. 1.
New Electronics Incorporating Electronics Today, 20 (1987) 26 May, No. 11, London, Great Britain, "Bargraph Display of Ratio".
Polytechnisch Tijdschrift Elektrotechniek, Elektronica, vol. 31, No. 4, pp. 209–210, Apr. 1976, "A light spot scale".

Primary Examiner—Kevin J. Teska
Assistant Examiner—Jacques H. Louis-Jacques
Attorney, Agent, or Firm—Pennie & Edmonds

[57] ABSTRACT

A device for optically providing information pertaining to the value of the quotient of the rates of revolution of two axles contains converters connected to the axles, which converters generate electrical signals which are a measure for the rate of revolution of the respective axles. At least one of the signals is fed to a ladder network of resistances which contains tap-off points which are connected to similar inputs of comparator circuits. The other inputs of the various amplifiers receive as input the signal which is a measure for the rate of revolution of the other axle. The comparator circuits are each coupled to light-emitting elements of which a few, depending upon the quotient of the revolution rates, illuminate. When applied in a vehicle which is provided with a continuously variable transmission, optical information pertaining to the current value of the transmission ratio is thus provided.

8 Claims, 1 Drawing Sheet

DISPLAY DEVICE

DESCRIPTION

The present invention pertains to a device for optically supplying information.

Such devices, constructed with electronic components and generally implemented as integrated circuits, are generally known. The known circuit generally contains a series of collation circuits implemented as comparator circuits, whereby in each case one input pin is connected to a reference voltage while the other corresponding input pin of the comparator in question is connected to a generally variable voltage via a resistor network which is generally connected as a tapped voltage divider. When the variable voltage exceeds threshold voltages tapped from the resistor network, a series of light-emitting elements coupled to each output of the comparator circuit is driven, depending on the number of thresholds which at any instant are exceeded by the variable voltage.

The known device which operates in relation to a fixed threshold is not suited to optically supplying information with regard to the quotient of two voltages.

The present invention's aim is to present a device for optically supplying information, which device is suited to the provision of information concerning the quotient of the rate of revolution of two axles.

To this end, the device according to the invention includes measures whereby each axle is coupled to a converter for the generation of electric signals at the input contacts of the device, which signals are a measure of the value of the rate of revolution of the axle in question, whereby at least one of the input contacts is connected to a resistor network connected as a tappable voltage divider, which resistor network's various tapping-points are coupled to similar inputs of a comparator circuit separately contained in the device, the other similar inputs of the comparator circuit each being coupled to the other input contacts, and where each comparator circuit is provided with an output coupled to a connection point on the supply voltage via light-emitting elements.

The advantage of the device according to the invention is that in an extremely simple manner, a device is presented which optically displays on light-emitting elements, the value of the quotient of (in this specific instant) the rates of revolution of two axles, in a manner whereby classical problems relating to the denominator of the quotient being extremely small or zero do not occur. The optical indication by the light-emitting elements is such that, in particular, the number of illuminated elements is a measure for the value of the quotient. The device according to the invention determines the quotient, while also functioning as driving means for the light-emitting elements.

An embodiment of the device according to the invention incorporates a scale-factor circuit connected between the converter in question and the corresponding input contact, which circuit is implemented as an amplifier or attenuator.

By means of this embodiment of the device according to the invention, the possibility is provided to vary the extreme values of the range of the quotient and thereby through adjustment of the value G of the amplification Qr attenuation of the scale-factor circuit to achieve an adjustment of the limits of the optical display range in accordance with the current rate of revolution of the relevant axles. In another embodiment of the device according to the invention, the mutual ratio of the values of the resistors in the resistor network is a measure of the values of the quotient, at which the consecutive light-emitting elements are illuminated.

In this manner, within the total range of quotient values inside which the light-emitting elements illuminate, the individual placement of the quotient values whereby the consecutive light-emitting elements are illuminated, can be adjusted.

A simple but nevertheless in general non-linear distribution of the quotient values at which the consecutive light-emitting elements are illuminated, can be achieved by simply making the values of the resistors herein equal in all cases.

In a preferential embodiment of the device according to the invention, the light-emitting elements are placed in a straight line next to each other, whereby the optical display of the relative information is presented in the form of a bar-graph.

An implementation of the light-emitting elements as LED's is preferable, as these are not only small but also have modest current requirements and are easily fitted in a vehicle. Where the device is implemented in a vehicle furnished with a continuously variable transmission, whose primary pulley forms the first axle and whose secondary pulley forms the other axle, the quotient of the rates of revolution of the two axles shall then be a measure for the current value of the transmission-ratio of the transmission.

Moreover, the invention pertains to a vehicle equipped with the above-mentioned device.

The present invention shall be further elucidated on the basis of the accompanying FIGURE's depiction of a possible embodiment of the device for optically supplying information pertaining to the value of, in particular, the transmission ratio in a continuously variable transmission.

The FIGURE shows a partially-drawn continuously variable transmission, containing a primary axle 1 with an adjustable primary pulley 2, and a secondary axle 3, upon which secondary axle an adjustable secondary pulley 4 is fitted. A driving belt 5 is located between the pulleys 2 and 4, which driving belt's working radius between the pulleys 2 and 4 is variable in a manner which is generally known.

The device for optically supplying information pertaining to the value of the quotient of the rates of revolution of the axles 1 and 3 is located to the right side of the FIGURE. Moreover, the device 6 under discussion contains converters 7 and 8 coupled to the axles 1 and 3, respectively, which converters are each composed in such a manner that, at output contacts $V_p$ and $V_s$, respectively, a signal, in particular a voltage, is generated, which signal is a measure for the speed of revolution of the primary axle 1 and the secondary axle 3, respectively.

A resistor network 10 connected as a voltage divider is located between input contact $V_p$ and a point 9 of the supply voltage. The voltage divider contains the consecutive resistors: $R_1, R_2, R_3 \ldots R_{n-1}, R_n$, between which the respective tap-points $A_1, A_2 \ldots A_{n-1}, A_n$ are located. Moreover, the device 6 contains successive comparator circuits $C_1, C_2 \ldots C_{n-1}, C_n$ with a $-$input, a $+$input, and with respective outputs, which are connected to the other point $V_c$ of the supply voltage via light-emitting elements $L_1, L_2 \ldots L_{n-1}, L_n$. In the depicted embodiment the tap-off points $A_1 \ldots A_n$ are connected to the respective +inputs of the comparator circuits $C_1 \ldots C_n$ and the related −inputs are connected as a group to contact $V_s$ of converter 8. In that case, the anodes of the light-emitting elements $L_1 \ldots L_n$ are connected to the point $V_c$, while the related cathodes of the elements (which elements are in this instance implemented as LED's) are connected to the related outputs of the comparator circuits $C_1 \ldots C_n$. It should be obvious that, given the signals $V_p$ and $V_s$ and given the desired means for optically supplying information with respect to the quotient of these signals, the specific manner in which the comparator circuits are driven and the specific manner in which the LED's $L_1 \ldots L_n$ are connected to the outputs of the comparison circuits, is of secondary importance and is related to the specific desired technical realisation of the device 6. It is self-evident that other types of light-emitting elements than LED's can be applied. Often, non-depicted resistors are included in series with the light-emitting elements to limit the current-draw and to prevent self-destruction of the elements through overheating.

In the depicted embodiment, the device 6 contains a scale-factor circuit 11 which is implemented as an amplifier or attenuator. When the transfer characteristic of the circuit 11 is given by G, then, given the input signal $V_s$, the signal $GV_s$ shall be applied at the −inputs of the comparator circuits $C_1 \ldots C_n$. The factor G provides the possibility of supplying the extremal values of the range within which the quotient of the rates of revolution of the axles 1 and 3 can vary; when, for example, 10 equally-valued resistors $R_1 \ldots R_{10}$ are applied in the resistor network 10, it is trivial to deduce that light-emitting element $L_i$ illuminates when the following condition is met:

$$\frac{V_p}{V_s} < \frac{10}{i} G$$

In the case of placement in a vehicle which is equipped with a continuously variable transmission, the light-emitting elements $L_1 \ldots L_n$ are preferably placed side-by-side in a straight line whereby it functions as a bar-graph, so that through the use of the LED's information is optically supplied concerning the current value of the transmission ratio of the continuously variable transmission. In this way, the driver of the vehicle in particular is continuously provided with information pertaining to the transmission ratio currently in effect.

I claim:

1. Device for optically supplying information pertaining to a value of a quotient of a rate of revolution of two axles (1, 3),
    each axle (1, 3) being coupled to a converter (7, 8) for generating respective electric signals at input contacts (Vp, Vs, GVs), each of which electric signals is a measure of a rate of revolution of the related axle (1, 3),
    at least one of the input contacts (Vp, Vs, GVs) is connected to a resistor network (10) connected as a tappable voltage divider, which resistor network's various tapping-points (A1 . . . An) are coupled to similar inputs of comparator circuits (C1 . . . Cn) separately contained in the device (6), the other similar inputs of the comparator circuits (C1 . . . Cn) each being coupled to the other input contacts (Vp, Vs, GVs), and
    each comparator circuit (C1 . . . Cn) is provided with an output coupled to a connection point (Vc) on the supply voltage via light-emitting elements (L1 . . . Ln) for optically displaying the information, the optical display being such that the number of illuminated elements is a measure of the value of the quotient.

2. Device according to claim 1, which device possesses a scale-factor circuit (11) connected between the pertinent converters (7, 8) and the corresponding input contact (Vp, GVs), which scale-factor circuit is implemented as an amplifier or attenuator.

3. Device according to claim 1 or 2, wherein the values of resistors (R1 . . . Rn) in the resistor network have a fixed mutual ratio, whereby the fixed mutual ratio is a measure for those values of the quotient as displayed by the respective illuminated light-emitting elements (L1 . . . Ln).

4. Device according to claim 1, whereby the values of the resistances ($R_1 \ldots R_n$) are equal.

5. Device according to claim 1, wherein light-emitting elements (L1 . . . Ln) connecting to neighbouring tap-off points (A1 . . . An) of the resistor network (10) are placed side-by-side.

6. Device according to claim 5, wherein the light-emitting elements (L1 . . . Ln) are placed side-by-side in a straight line.

7. Device according to claims 5 or 6, wherein the light-emitting elements (L1 . . . Ln) are defined by LED's.

8. Vehicle provided with a device (6) according claim 1, and with a continuously variable transmission having a current transmission ratio value and comprising a primary pulley (2) forming a first axle (1) of said axles and a secondary pulley (4) forming a second axle (3), with the quotient of the rates of revolution of the two axles (1, 3) being a measure for the current transmission ratio value.

* * * * *